(12) United States Patent
Ramachandran et al.

(10) Patent No.: US 10,537,997 B2
(45) Date of Patent: Jan. 21, 2020

(54) SENSOR BASED AUTO-CALIBRATION WAFER

(71) Applicant: Applied Materials, Inc., Santa Clara, CA (US)

(72) Inventors: Narayanan Ramachandran, Bangalore (IN); Karthik Narayanan Balakrishnan, Chennai (IN); Rajkumar Thanu, Bangalore (IN); Jeffrey Hudgens, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 116 days.

(21) Appl. No.: 15/591,694

(22) Filed: May 10, 2017

(65) Prior Publication Data

US 2017/0326733 A1 Nov. 16, 2017

Related U.S. Application Data

(60) Provisional application No. 62/336,450, filed on May 13, 2016.

(51) Int. Cl.
*B25J 9/16* (2006.01)
*H01L 21/67* (2006.01)
(Continued)

(52) U.S. Cl.
CPC ...... *B25J 9/1692* (2013.01); *H01L 21/67259* (2013.01); *H01L 21/6875* (2013.01);
(Continued)

(58) Field of Classification Search
CPC .............. B25J 9/1692; H01L 21/67259; H01L 21/6875; H01L 21/68; G05B 2219/39047
See application file for complete search history.

(56) References Cited

U.S. PATENT DOCUMENTS 6,032,512 A * 3/2000 Li ........................... H01L 21/68
73/1.79
6,244,121 B1 6/2001 Hunter
(Continued)

OTHER PUBLICATIONS

Khiat, A., et al. "Two-dimension fiber optic sensor for high-resolution and long-range linear measurements." Sensors and Actuators A: Physical 158.1 (2010): 43-50 (Year: 2010).*
(Continued)

*Primary Examiner* — Dale Moyer
(74) *Attorney, Agent, or Firm* — Patterson + Sheridan LLP

(57) ABSTRACT

Embodiments described herein generally relate to an apparatus and method of performing a robot calibration process within a substrate processing system. In one embodiment, a calibration device is used to calibrate a robot having an end effector. The calibration device includes a body, a first side and a second side opposite to the first side. The calibration device further includes a sensor disposed on the second side of the body. In some embodiments, the sensor covers the entire second side of the body. In this configuration, because the sensor covers the entire second side of the body of the calibration device, the calibration device can be utilized to sense the contact between the sensor and various differently configured chamber components found in different types of processing chambers or stations disposed within a processing system during a calibration process performed in each of the different processing chambers or stations.

20 Claims, 8 Drawing Sheets

(51) Int. Cl.
*H01L 21/687* (2006.01)
*B25J 13/08* (2006.01)
*B25J 19/02* (2006.01)

(52) U.S. Cl.
CPC .............. *B25J 13/08* (2013.01); *B25J 13/084* (2013.01); *B25J 19/021* (2013.01); *B25J 19/028* (2013.01); *G05B 2219/37068* (2013.01); *G05B 2219/37608* (2013.01); *G05B 2219/39047* (2013.01); *G05B 2219/39056* (2013.01)

(56) References Cited

U.S. PATENT DOCUMENTS

| | | | |
|---|---|---|---|
| 6,966,235 | B1 | 11/2005 | Paton |
| 7,085,622 | B2 | 8/2006 | Sadighi et al. |
| 7,107,125 | B2 | 9/2006 | Yim et al. |
| 7,319,920 | B2 | 1/2008 | Donoso et al. |
| 7,434,485 | B2 | 10/2008 | Hunter |
| 7,456,977 | B2 | 11/2008 | Ramsey et al. |
| 8,224,607 | B2 | 7/2012 | Sakhare et al. |
| 2003/0075936 | A1* | 4/2003 | Hsu ............... H01L 21/67265 294/213 |
| 2004/0098216 | A1* | 5/2004 | Ye ................ G01D 9/005 702/127 |
| 2008/0097646 | A1* | 4/2008 | Ramsey ......... H01L 21/67259 700/258 |
| 2009/0062959 | A1* | 3/2009 | Sakhare ............. B25J 9/1692 700/254 |
| 2009/0276176 | A1 | 11/2009 | Schulze et al. |
| 2012/0271590 | A1* | 10/2012 | Sakhare ............. B25J 9/1692 702/151 |
| 2015/0015511 | A1* | 1/2015 | Kwak .................. G06F 3/0412 345/173 |
| 2015/0235881 | A1 | 8/2015 | Adderly et al. |
| 2015/0369583 | A1 | 12/2015 | Potter, Sr. |
| 2017/0365531 | A1* | 12/2017 | Tedeschi .............. H01L 22/26 |

OTHER PUBLICATIONS

PCT Notification of Transmittal of the International Search Report and the Written Opinion of the International Searching Authority for Application No. PCT/US2017/029697; dated Jul. 27, 2017; 12 total pages.

* cited by examiner

SENSOR BASED AUTO-CALIBRATION WAFER

CROSS-REFERENCE TO RELATED APPLICATIONS

This application claims priority to U.S. Provisional Patent Application Ser. No. 62/336,450, filed on May 13, 2016, which is incorporated herein by reference.

BACKGROUND

Field

Embodiments described herein generally relate to robot calibration, and more specifically to a calibration device for performing robot calibrations.

Description of the Related Art

The use of robots in automated processing systems has become increasingly popular. Robots can often perform repeated tasks with the precision and efficiency generally not achievable through the use of human labor. Moreover, robots can be used in locations where the proximity to moving components or sensitive environments makes the use of human labor in such locations undesirable.

This is particularly important in semiconductor processing systems where misplaced or out-of-position substrates result in costly damage or/and unscheduled system maintenance. Misaligned substrates are often damaged, damage other substrates or equipment, or are poorly processed due to misalignment and may be discarded. In order to ensure precise positioning of substrates moved by the robot, reference points or coordinates for a predetermined position of the robot's end effector is typically entered into a memory of a robot controller as part of a calibration procedure. Acquiring the reference coordinates generally involves moving, or "jogging," the end effector to a predetermined position, typically through a manual or an automated sequence. Arrival of the robot's end effector at the predetermined position may be confirmed by manually observing the end effector position with or without the help of a calibration tool, or by having the end effector (or other component of the robot) trigger a sensor, such as a limit switch. This sequence is typically repeated until all the reference coordinates for each critical position within the robot's range of motion throughout the system has been established (i.e., entered into the robot's or robot controller's memory). Once the reference coordinates have been established, the robot can move the end effector with precision and accuracy into critical positions by returning to the reference coordinates.

In many semiconductor processing systems, jogging of the robot's end effector and the confirmation of the end effector's arrival at the reference coordinate is done manually. An operator must observe the location of the end effector relative to an object or target within the processing system to visually estimate the position of the end effector. In order to adequately view the end effector when performing this task, the processing system is typically opened to the surrounding environment. This undesirably places the operator(s) in a position where they are exposed to the range of motion of the robot which can lead to personal injury or system damage. Thus, to prevent possible injury to the operator, the processing system is normally shut down so that the robot does not inadvertently make contact with the operator, possibly damaging product, tooling or the operator.

As the system is exposed to the surrounding environment, decontamination procedures are performed prior to processing. Moreover, lengthy pump-downs are performed to return the system to operation pressures. During periods where the system is shut down, no substrates are processed and valuable production time is lost.

Therefore, a need exists for an improved calibration device and method for resolving the problems described above.

SUMMARY

In one embodiment, a calibration device includes a body having a first surface and a second surface opposite the first surface, a sensor disposed on the second surface, and the sensor covers the second surface. The calibration device further includes a battery disposed on the first surface and a data storage or transmitter disposed on the first surface.

In another embodiment, a calibration device includes a body having a first surface having an edge portion, a second surface opposite the first surface, and a third surface connecting the edge portion of the first surface and the second surface. The calibration device further includes a sensor disposed on the second surface, and the sensor covers the second surface, the edge portion of the first surface, and the third surface. The calibration device further includes a battery disposed on the first surface and a data storage or transmitter disposed on the first surface.

In another embodiment, a method includes placing a calibration device on a first substrate support located inside of a first station by a robot, receiving contact or proximity data from the calibration device, calculating a center point location of the first substrate support on the calibration device based on the contact or proximity data, comparing the calculated center point location of the first substrate support on the calibration device to an actual center point location of the calibration device to determine an offset between the calculated center point location of the first substrate support on the calibration device and the actual center point location of the calibration device, and calibrating the robot using the offset.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to an apparatus and method of performing a robot calibration process within a substrate processing system. In one embodiment, a calibration device is used to calibrate a robot having an end effector. The calibration device includes a body, a first side and a second side opposite to the first side. The calibration device further includes a battery disposed on the first side of the body, a data storage or transmitter disposed on the first side of the body, and a sensor disposed on the second side of the body. In some embodiments, the sensor covers the entire second side of the body. In this configuration, because the sensor covers the entire second side of the body of the calibration device, the calibration device can be utilized to sense the contact between the sensor and various differently configured chamber components found in different types of processing stations, or also referred to herein as a processing chamber, disposed within a processing system during a calibration process performed in each of the different processing stations.

Figure 1A:
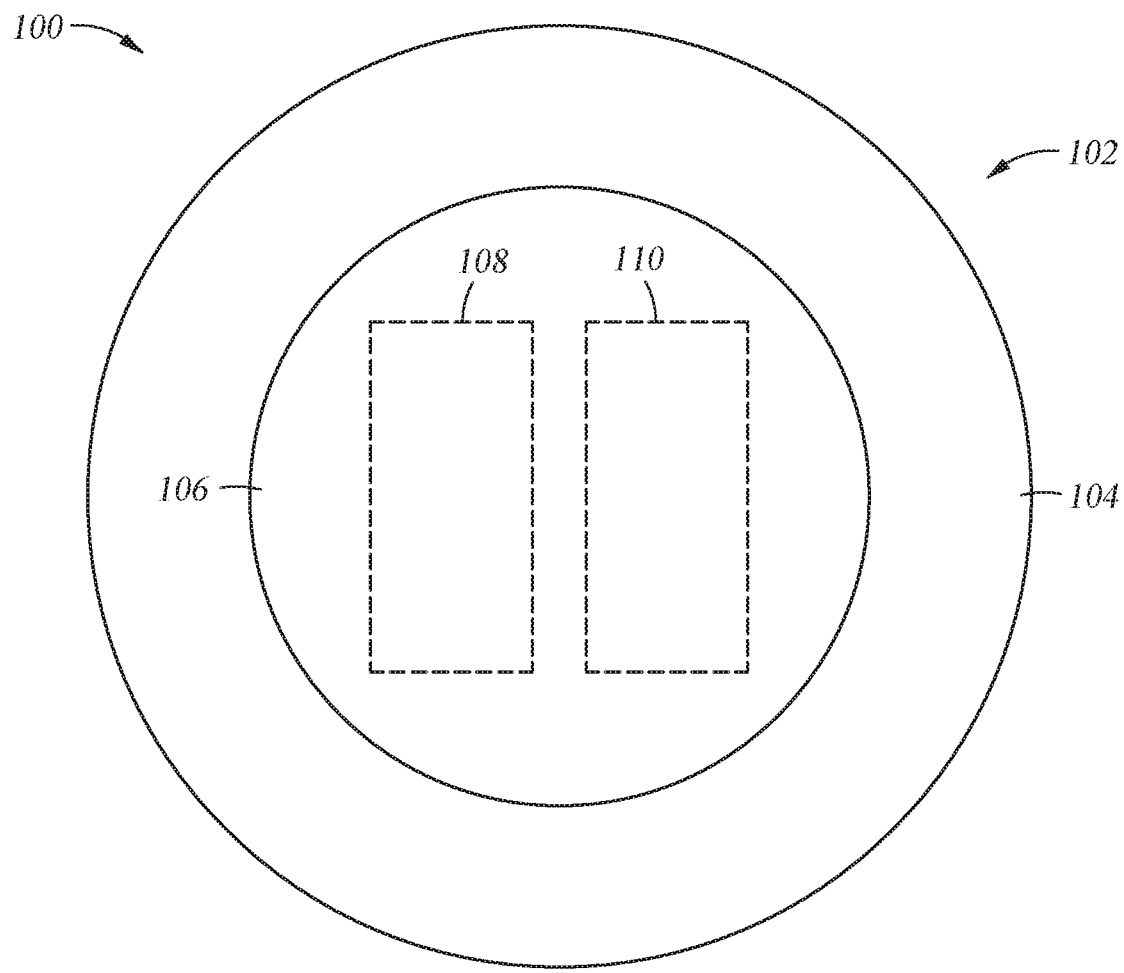
FIG. 1A illustrates a schematic top view of a calibration device according to one embodiment described herein.

FIG. 1A illustrates a schematic, top view of a calibration device 100 according to one embodiment described herein. As shown in FIG. 1A, the calibration device 100 includes a body 102 having a first surface 104. The body 102 may be made of any suitable material that is both vacuum and atmospheric pressure compatible. In one embodiment, the body 102 is made of glass. The body 102 may have the same shape and size as a substrate to be processed in one or more processing chambers. In one embodiment, the body 102 is circular and has a diameter ranging from about 150 mm to 450 mm or larger. In some embodiments, the body 102 is rectangular or square. A battery 108 and a data storage or transmitter 110 may be disposed on the first surface 104. An enclosure 106 may be disposed on the first surface 104 and may enclose the battery 108 and the data storage or transmitter 110.

Figure 1B:
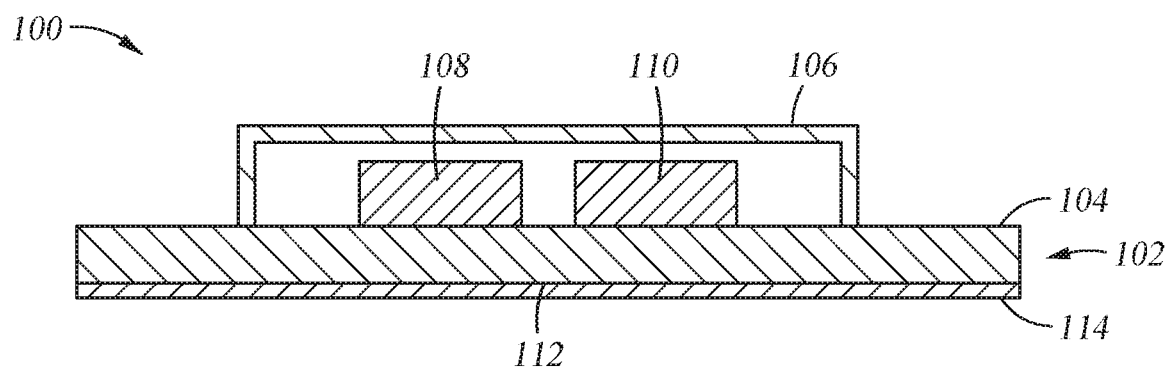
FIG. 1B illustrates a schematic cross-sectional side view of the calibration device according to one embodiment described herein.

FIG. 1B illustrates a schematic, cross-sectional side view of the calibration device 100 according to one embodiment described herein. As shown in FIG. 1B, the body 102 further includes a second surface 112 opposite the first surface 104. A sensor 114 is disposed on the second surface 112. The sensor 114 covers the entire second surface 112. The sensor 114 may be any suitable sensor capable of sensing contact and/or proximity of the body 102 to other external components, such as substrate support components. The sensor 114 may include capacitive, piezoelectric, resistive, or other suitable type of contact and/or proximity sensing device. In one example, the sensor 114 is a tactile or optical proximity sensor. In one example, the sensor 114 is a capacitive sensing device that is able to sense a change in capacitance due to the contact or proximity of an external component to a region of the sensor 114. In one embodiment, the sensor 114 may have a resolution of at least 30 microns across the surface of the sensor. The sensor 114 is powered by the battery 108. The sensed data by the sensor 114 is received by the data storage or transmitter 110 and then wirelessly transmitted to a controller. The data storage or transmitter 110 may be any suitable data storage or transmitter, such as a wireless transmitter using Bluetooth® or other suitable protocol. In some embodiments, the data storage or transmitter 110 may include a processor (not shown) and non-volatile memory (not shown) that are collectively able to drive the sensing process performed by the sensor 114 and then process the data received from the sensor 114 before it is transmitted by the data storage or transmitter 110 to the controller. In some embodiments, the data storage or transmitter 110 includes an onboard memory card that can be removed from the calibration device 100 and installed onto the controller.

Figure 2A:
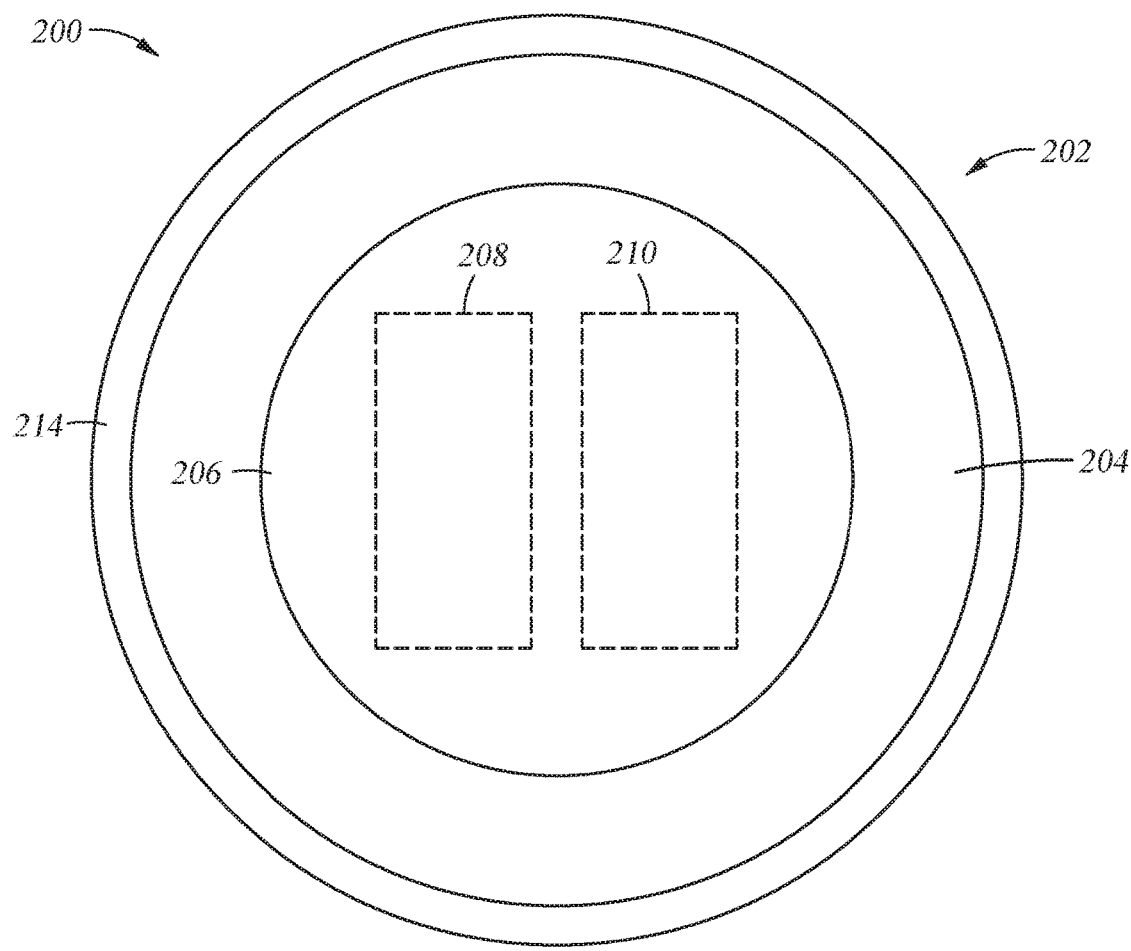
FIG. 2A illustrates a schematic top view of a calibration device according to one embodiment described herein.

FIG. 2A illustrates a schematic, top view of a calibration device 200 according to one embodiment described herein. As shown in FIG. 2A, the calibration device 200 includes a body 202 having a first surface 204. The body 202 may be the same as the body 102 of the calibration device 100. A battery 208 and a data storage or transmitter 210 may be disposed on the first surface 204. An enclosure 206 may be disposed on the first surface 204 and may enclose the battery 208 and the data storage or transmitter 210. The battery 208 may be the same as the battery 108, and the data storage or transmitter 210 may be the same as the data storage or transmitter 110. The first surface 204 may include an edge portion 216 (FIG. 2B), and the edge portion 216 may be covered by a sensor 214.

Figure 2B:
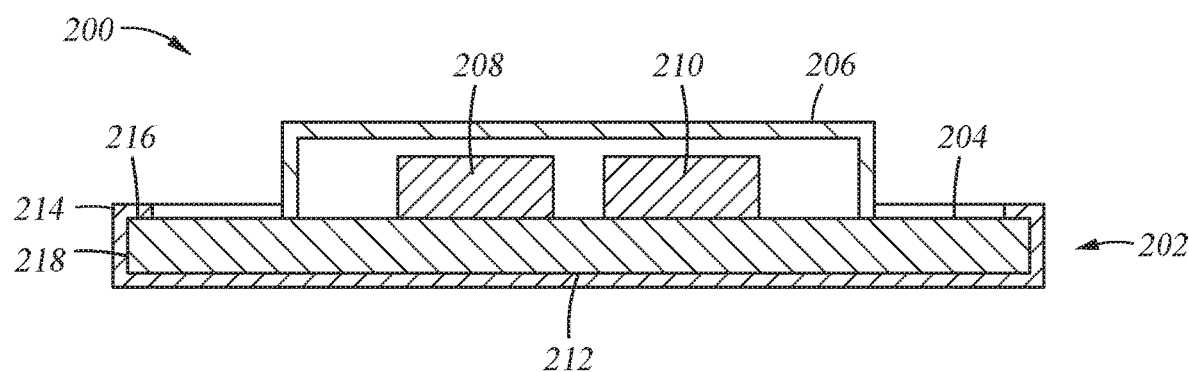
FIG. 2B illustrates a schematic cross-sectional side view of the calibration device according to one embodiment described herein.

FIG. 2B illustrates a schematic, cross-sectional side view of the calibration device 200 according to one embodiment described herein. As shown in FIG. 2B, the body 202 further includes a second surface 212 opposite the first surface 204 and a third surface 218 connecting the edge portion 216 of the first surface 204 and the second surface 212. The sensor 214 may be disposed on the body 202 such that the entire second surface 212, the third surface 218 (e.g., bevel region), and the edge portion 216 of the first surface 204 are covered by the sensor 214. The sensor 214 may be the same type of sensor as the sensor 114. The sensor 214 is powered by the battery 208. The sensed data by the sensor 214 is received by the data storage or transmitter 210 and then wirelessly transmitted to a controller.

Figure 3:
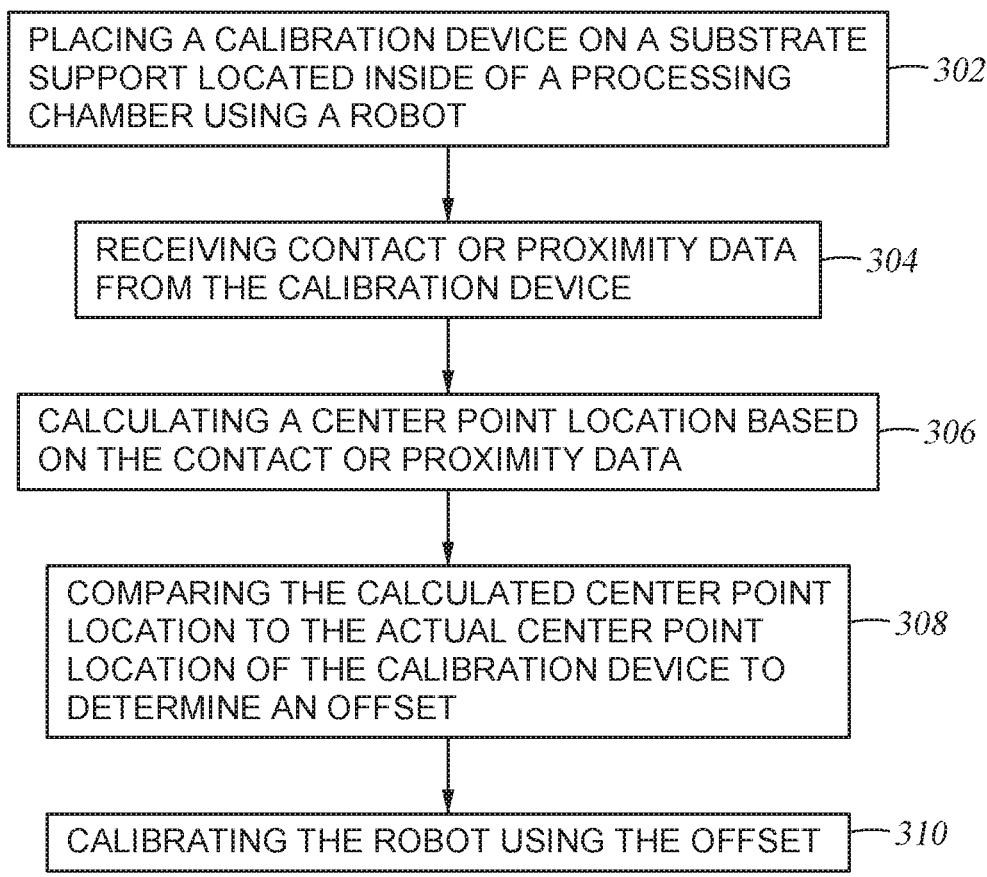
FIG. 3 illustrates a flow diagram for a method for calibrating a robot according to one embodiment described herein.

FIG. 3 illustrates a flow diagram for a method 300 for calibrating a robot according to one embodiment disclosed herein. As shown in FIG. 3, the method 300 starts at block 302, which is placing a calibration device on a substrate support located inside of a processing chamber using a robot. The calibration device may be the calibration device 100 or the calibration device 200. The substrate support may be any type of substrate support. FIGS. 4A-7A illustrate various types of substrate supports. The processing chamber may be any suitable type of substrate processing chamber, such as semiconductor device processing chamber that may include a thermal processing chamber, a material deposition chamber, an etch chamber, an implant chamber, a clean chamber, a nitridation chamber, or an oxidation chamber. The chamber or station may be a pre-aligner, load ports, pass thru/buffer stations, or any suitable stations. The robot may be any suitable robot for transferring the calibration device, such as a SCARA robot. In some embodiments, the robot includes an end effector that is coupled to an actuation device that is adapted to control the movement and positioning of the end effector during use.

As shown in FIGS. 4A-7A, the substrate support may include one or more substrate contact points, and a sensor, such as the sensor 114 or 214, of the calibration device is positioned so that it is in contact with the one or more of the contact points. The sensor may cover the entire bottom surface of the calibration device, such as the sensor 114 covering the entire second surface 112 of the calibration device 100. The sensor may cover the entire bottom surface, an edge portion of the top surface, and a side surface of the calibration device, such as the sensor 214 covering the entire second surface 212, the edge portion 216 of the first surface 204, and the third surface 218 of the calibration device 200. In some embodiments, the substrate support is a flat surface and the entire sensor is in contact with the flat surface of the substrate support. An edge ring may be disposed around the calibration device either on the substrate support or slightly above the substrate support. The sensor covering the side surface and the edge portion of the top surface may be a proximity detection sensor that can sense the presence of the edge ring.

Next, at block 304, the contact or proximity data sensed by the sensor of the calibration device is received by a data storage or transmitter, such as the data storage or transmitter 110 or 210. The contact or proximity data is transmitted to a controller by the data storage or transmitter. A center point location of the substrate support on the calibration device is then calculated by the controller based on the contact or proximity data, as shown at block 306.

Next, at block 308, the calculated center point location of the substrate support on the calibration device is compared to the actual center point location of the calibration device. If the calibration device is placed on the center of the substrate support by the robot, the calculated center point location of the substrate support on the calibration device would match the actual center point location of the calibration device. However, if the calibration device is placed off center on the substrate support by the robot, an offset between the calculated center point location of the substrate support relative to the calibration device and the actual center point location of the calibration device is determined. The actual center point location of the calibration device can be stored in memory of the controller, or the memory on the calibration device, and can be predetermined from the knowledge of the position of the sensor's sensing components relative to the body. The determined offset is used to calibrate the robot, as shown at block 310. After adjusting the calibration of the robot using the determined offset data, the calculated center point location of the substrate support on the calibration device will match the actual center point location of the calibration device. The calibrated robot can then place a substrate to be processed on the substrate support located inside of the processing chamber, and the substrate is placed at the center of the substrate support by the robot.

Figure 4A:
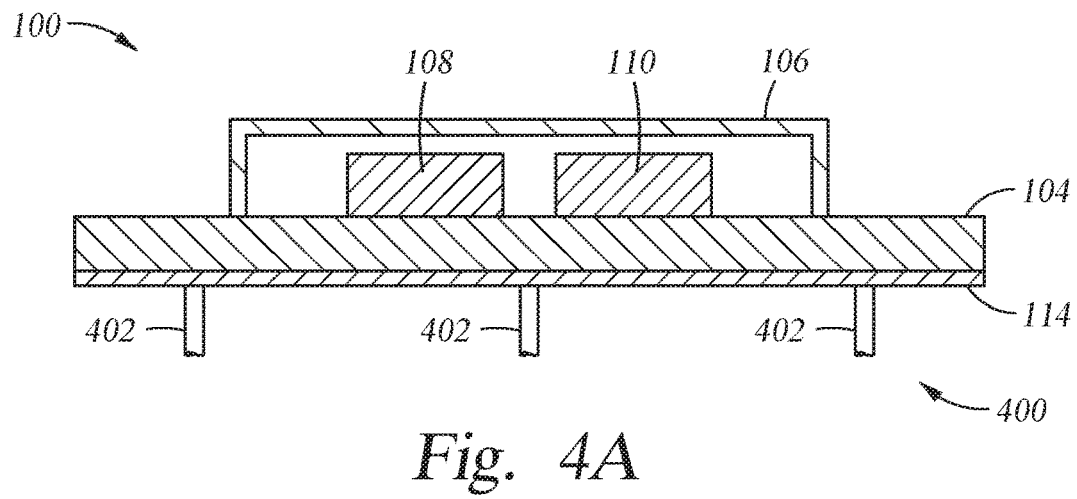
FIG. 4A schematically illustrates the calibration device supported by a substrate support according to one embodiment described herein.
Figure 4B:
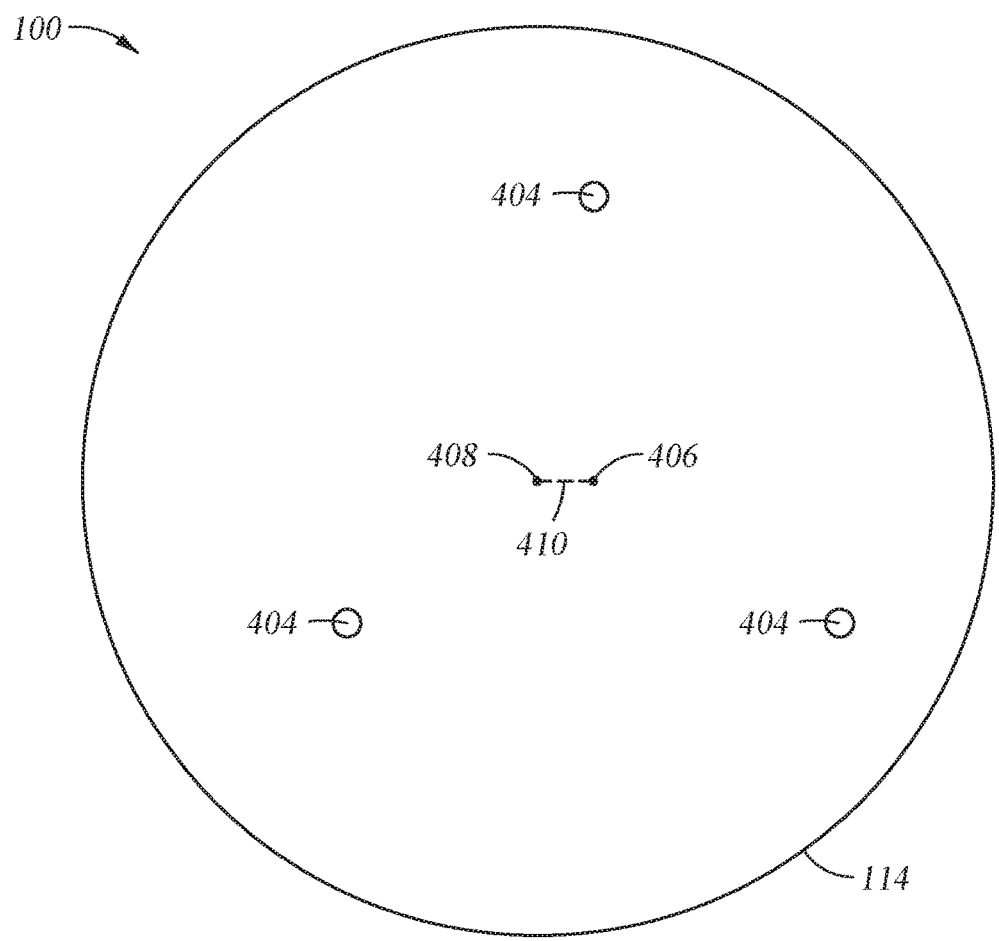
FIG. 4B schematically illustrates a bottom view of the calibration device showing contact points according to one embodiment described herein.

FIG. 4A schematically illustrates the calibration device 100 supported by a substrate support 400 according to embodiments disclosed herein. As shown in FIG. 4A, the substrate support 400 includes a plurality of lift pins 402. The sensor 114 of the calibration device 100 is placed on the lift pins 402 by a robot. The sensor 114 of the calibration device 100 is thus in contact with the plurality of lift pins 402. FIG. 4B schematically illustrates a bottom view of the calibration device 100 showing contact points 404 according to one embodiment described herein. As shown in FIG. 4B, a plurality of contact points 404 are sensed by the sensor 114 of the calibration device 100 as the sensor 114 contacts the plurality of lift pins 402 of the substrate support 400. A contact point signal relating to the contact points 404 are received by the data storage or transmitter 110 and the position related information relating to each of the contact points is then wirelessly transmitted to a controller. The controller then uses the received information to calculate a center point location 406 of the plurality of lift pins 402 of the substrate support 400 on the calibration device 100.

If the calibration device 100 is placed off center on the substrate support 400 by the robot, the actual center point location 408 of the calibration device 100 would not match the calculated center point location 406 of the plurality of lift pins 402 of the substrate support 400. The actual center point location 408 of the calibration device 100 may be stored in the memory within the controller or the calibration device 100. An offset 410 between the calculated center point location 406 of the substrate support 400 on the calibration device 100 and the actual center point location 408 of the calibration device 100 is determined by the controller. For example, if the actual center point location 408 of the calibration device 100 is located at (0,0) of a Cartesian plane, and the calculated center point location 406 based on the contact points 404 is located at (0,1) of the Cartesian plane, the offset 410 would be one unit down along the Y-axis. When the offset is used to calibrate the robot, an end effector of the robot is calibrated to move one unit down along the Y-axis in order to align the calculated center point location 406 with the actual center point location 408.

Figure 5A:
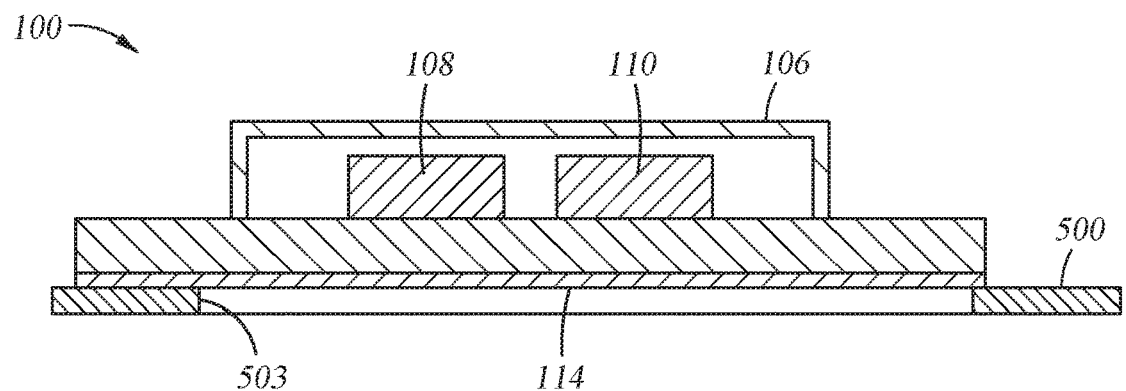
FIG. 5A schematically illustrates the calibration device supported by a substrate support according to one embodiment described herein.
Figure 5B:
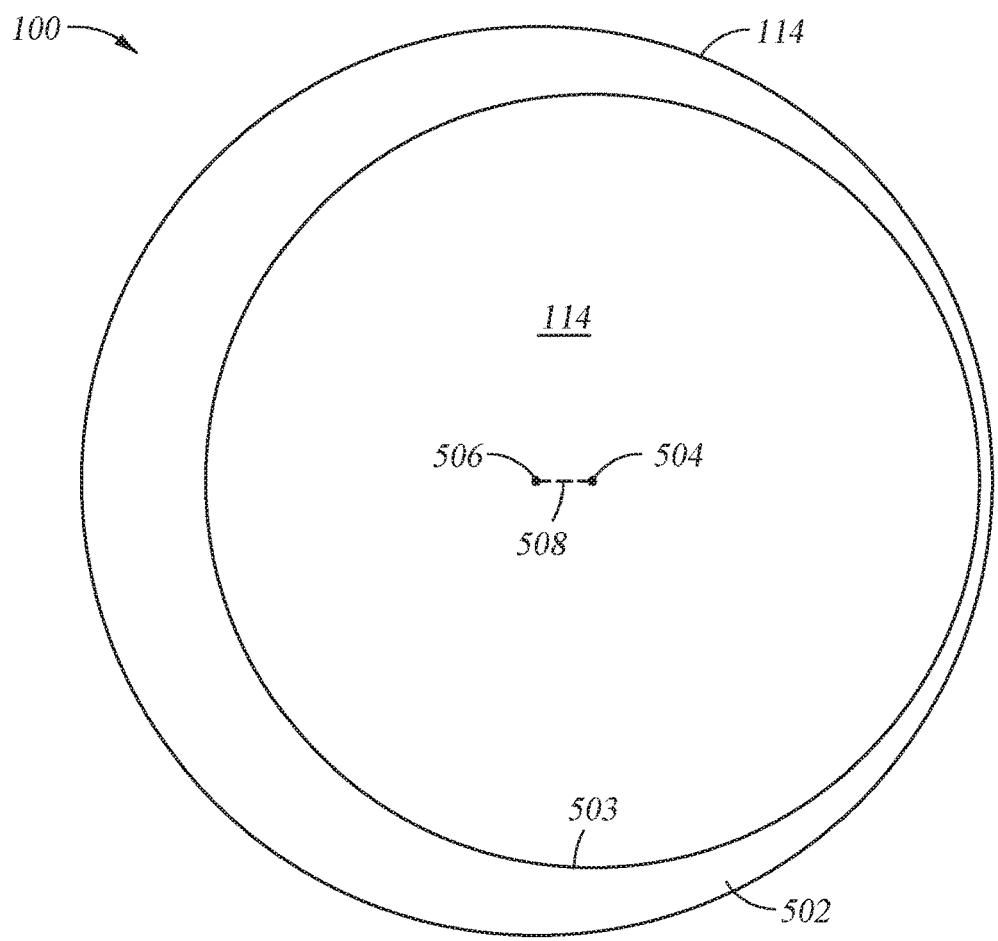
FIG. 5B schematically illustrates a bottom view of the calibration device showing a contact point according to one embodiment described herein.

FIG. 5A schematically illustrates the calibration device 100 supported by a substrate support 500 according to embodiments disclosed herein. As shown in FIG. 5A, the substrate support 500 may be an annular ring having an inner edge 503. The sensor 114 of the calibration device 100 is placed on the substrate support 500 by a robot. The edge of the sensor 114 of the calibration device 100 is in contact with the substrate support 500. FIG. 5B schematically illustrates a bottom view of the calibration device 100 showing a contact point 502 according to one embodiment described herein. As shown in FIG. 5B, the contact point 502 is sensed by the sensor 114 of the calibration device 100 as the sensor 114 contacts the substrate support 500. In some configurations, as shown in FIG. 5B, the contact point 502 may include a plurality of contact points that cover a region of the sensor, such as an annular region near the edge of the calibration device 100. A contact point signal relating to the contact point 502 is received by the data storage or transmitter 110 and the position related information relating to each of the contact points is then wirelessly transmitted to a controller. The controller then uses the received information to calculate a center point location 504 of the substrate support 500 on the calibration device 100. The calculated center point location 504 may be calculated by identifying a center point of the inner edge 503 of the substrate support 500. If the calibration device 100 is placed off center of the substrate support 500, the inner edge 503 of the substrate support 500 and the calibration device 100 may not be concentric. Therefore, the calculated center point location 504 is not aligned with an actual center point location 506 of the calibration device 100.

If the calibration device 100 is placed off center on the substrate support 500 by the robot, the actual center point location 506 of the calibration device 100 would not match the calculated center point location 504 of the substrate support 500. The actual center point location 408 of the calibration device 100 may be stored in the memory within the controller or the calibration device 100. An offset 508 between the calculated center point location 504 of the substrate support 500 on the calibration device 100 and the actual center point location 506 of the calibration device 100 is determined by the controller. For example, if the actual center point location 506 of the calibration device 100 is located at (0,0) of a Cartesian plane, and the calculated center point location 504 based on the contact point 502 is located at (0,1) of the Cartesian plane, the offset 508 would be one unit down along the Y-axis. When the offset is used to calibrate the robot, an end effector of the robot is calibrated to move one unit down along the Y-axis in order to align the calculated center point location 504 with the actual center point location 506.

Figure 6A:
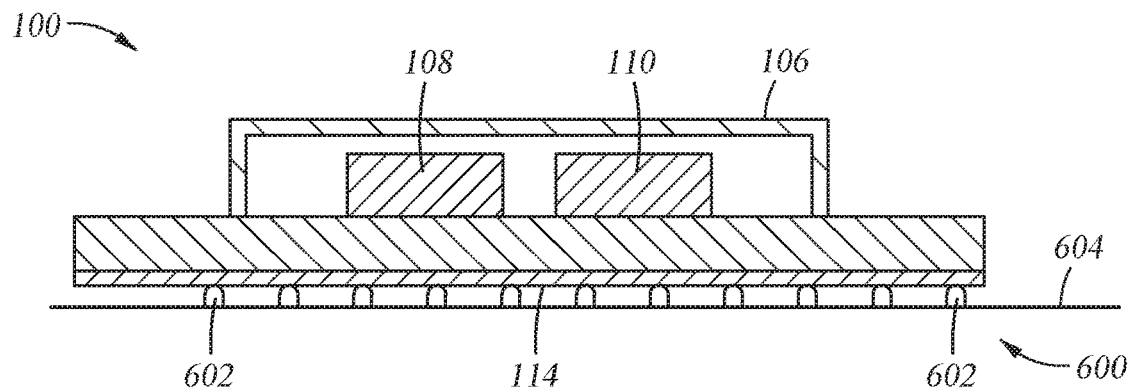
FIG. 6A schematically illustrates the calibration device supported by a substrate support according to one embodiment described herein.
Figure 6B:
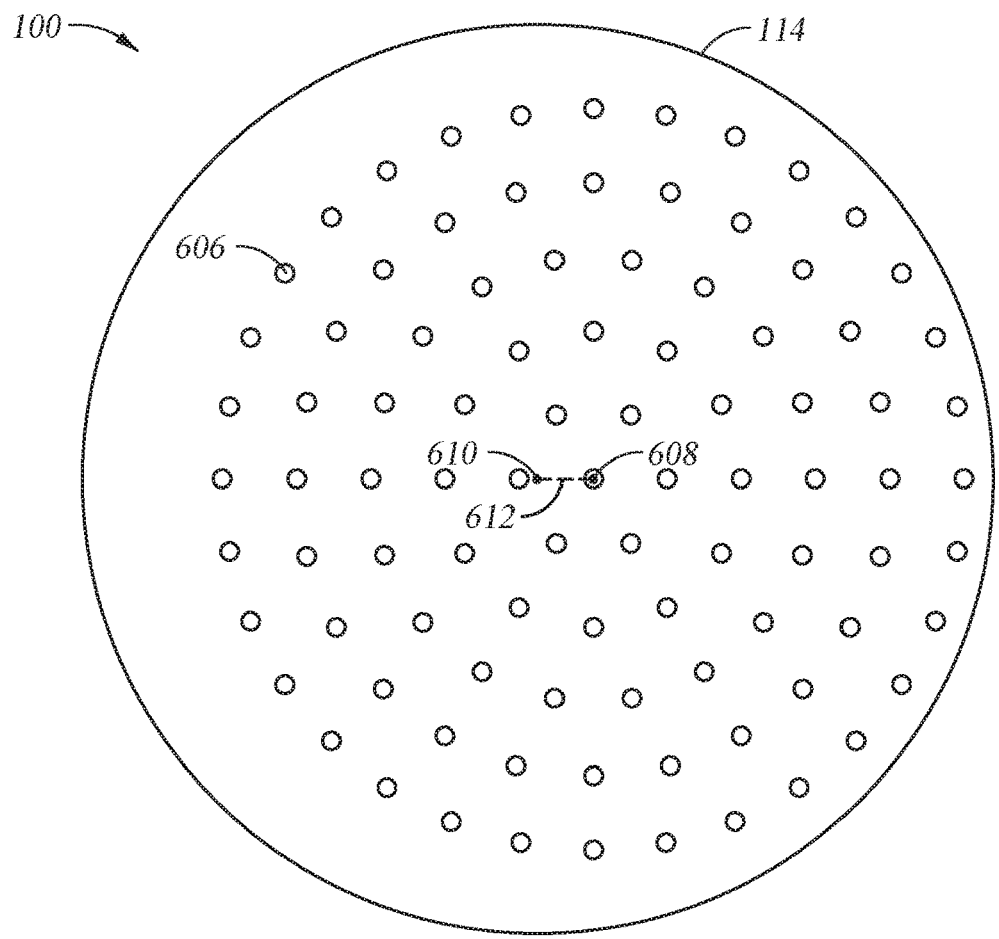
FIG. 6B schematically illustrates a bottom view of the calibration device showing contact points according to one embodiment described herein.

FIG. 6A schematically illustrates the calibration device 100 supported by a substrate support 600 according to embodiments disclosed herein. As shown in FIG. 6A, the substrate support 600 may include a plurality of protrusions 602 formed on a surface 604. The sensor 114 of the calibration device 100 is placed on the plurality of protrusions 602 of the substrate support 600 by a robot. In one example, the plurality of protrusions 602 may include, for example, an array of gas channels and/or minimum contact type supporting features formed on the substrate support. The sensor 114 of the calibration device 100 is in contact with the plurality of protrusions 602 of the substrate support 600. FIG. 6B schematically illustrates a bottom view of the calibration device 100 showing contact points 606 according to one embodiment described herein. As shown in FIG. 6B, the contact points 606 are sensed by the sensor 114 of the calibration device 100 as the sensor 114 contacts the plurality of the protrusions 602 of the substrate support 600. A contact point signal relating to the contact points 606 are received by the data storage or transmitter 110 and the position related information relating to each of the contact points is then wirelessly transmitted to a controller. The controller then uses the received information to calculate a center point location 608 of the plurality of protrusions 602 of the substrate support 600 on the calibration device 100. In some embodiments, the pattern of the plurality of protrusions 602 may be stored in a memory of the controller, and/or the center point location 608 of the plurality of protrusions 602 may also be stored in the memory of the controller. The controller can either calculate the center point location 608 based on the contact data or provide the center point location 608 based on the protrusion pattern found in the detected contact data.

If the calibration device 100 is placed off center on the plurality of protrusions 602 of the substrate support 600 by the robot, the actual center point location 610 of the calibration device 100 would not match the calculated center point location 608 of the plurality of protrusions 602 of the substrate support 600. The actual center point location 610 of the calibration device 100 may be stored in the memory within the controller or the calibration device 100. An offset 612 between the calculated center point location 608 of the plurality of protrusions 602 of the substrate support 600 on the calibration device 100 and the actual center point location 610 of the calibration device 100 is determined by the controller. For example, if the actual center point location 610 of the calibration device 100 is located at (0,0) of a Cartesian plane, and the calculated center point location 608 based on the contact points 606 is located at (0,1) of the Cartesian plane, the offset 612 would be one unit down along the Y-axis. When the offset is used to calibrate the robot, an end effector of the robot is calibrated to move one unit down along the Y-axis in order to align the calculated center point location 608 with the actual center point location 610.

Figure 7A:
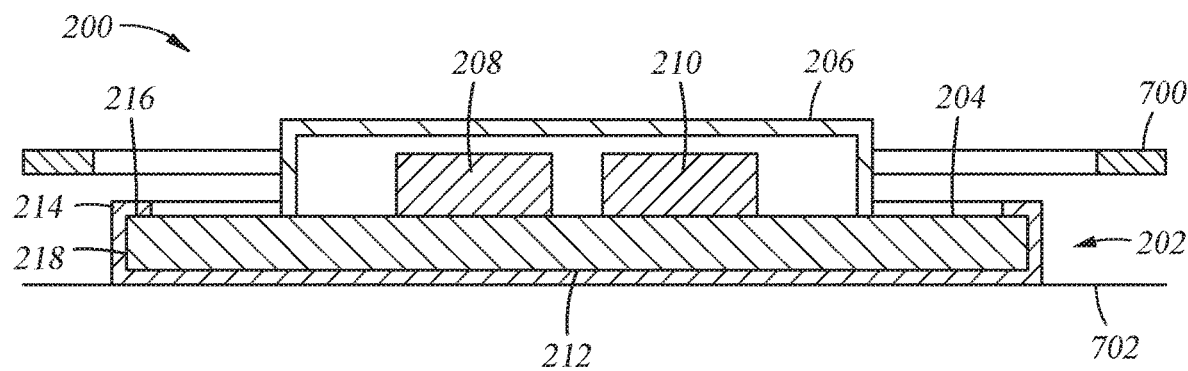
FIG. 7A schematically illustrates the calibration device supported by a substrate support and surrounded by a shadow ring according to one embodiment described herein.
Figure 7B:
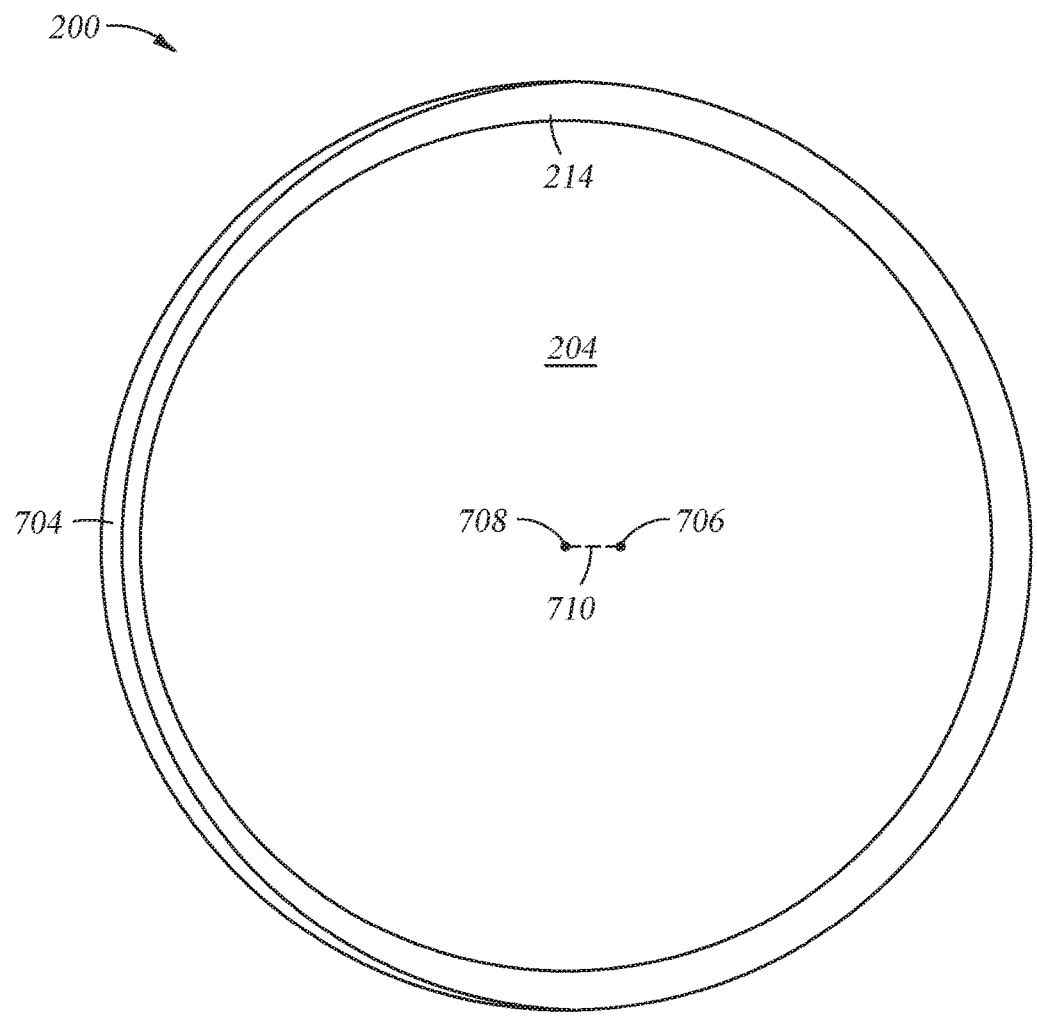
FIG. 7B schematically illustrates a top view of the calibration device showing a proximity point according to one embodiment described herein.

FIG. 7A schematically illustrates the calibration device 200 supported by a substrate support 702 and surrounded by a shadow ring 700 according to one embodiment described herein. As shown in FIG. 7A, the substrate support 702 is a flat surface. The sensor 214 of the calibration device 200 is placed on the substrate support 702 by a robot. The shadow ring 700 may be disposed over the substrate support 702 surrounding the calibration device 200. The portion of the sensor 214 disposed on the edge portion 216 of the first surface 204 senses the presence of the shadow ring 700 since the sensor 214 is a proximity sensor. FIG. 7B schematically illustrates a top view of the calibration device 200 showing a proximity point 704 according to one embodiment described herein. The enclosure 206, the battery 208 and the data storage or transmitter 210 are omitted in FIG. 7B. As shown in FIG. 7B, the proximity point 704 is sensed by the sensor 214 of the calibration device 200 as the sensor 214 is disposed near a portion of the shadow ring 700. A contact point signal relating to the proximity point 704 is received by the data storage or transmitter 210 and the position related information relating to each of the contact points is then wirelessly transmitted to a controller. The controller then uses the received information to calculate a center point location 706 of the shadow ring 700 on the calibration device 200.

If the calibration device 200 is placed off center on the substrate support 702 relative to the shadow ring 700 by the robot, the actual center point location 708 of the calibration device 200 would not match the calculated center point location 706 of the shadow ring 700. The actual center point location 708 of the calibration device 200 may be stored in the memory within the controller or the calibration device. An offset 710 between the calculated center point location 706 of the shadow ring 700 on the calibration device 200 and the actual center point location 708 of the calibration device 200 is determined by the controller. For example, if the actual center point location 708 of the calibration device 200 is located at (0,0) of a Cartesian plane, and the calculated center point location 706 based on the proximity point 704 is located at (0,1) of the Cartesian plane, the offset 710 would be one unit down along the Y-axis. When the offset is used to calibrate the robot, an end effector of the robot is calibrated to move one unit down along the Y-axis in order to align the calculated center point location 706 with the actual center point location 708.

In some embodiments, the shadow ring 700 is not present and instead an edge ring is disposed on the substrate support 702 surrounding the calibration device 200. The portion of the sensor 214 located on the third surface 218 of the calibration device 200 can sense the presence of the edge ring. An offset can be determined if the calculated center point location of the edge ring on the calibration device 200 is not aligned with the actual center point location of the calibration device 200.

FIGS. 4A-4B, 5A-5B, 6A-6B and 7A-7B illustrate examples of various types of substrate supports. The substrate supports illustrated may have different support point(s) (i.e., contact point(s)). If the calibration device having one or more sensors located at specific locations corresponding to the support points, the calibration device is only useful for a specific type of substrate support. In addition, if the calibration device is off center by a large distance, the one or more sensors may not be able to sense the contact point(s). Thus, the calibration device, such as the calibration device 100 or 200 having a sensor covering at least the entire bottom surface (i.e., contact surface), can be used to sense the contact or proximity point(s) regardless of how far the calibration device is off center. Furthermore, the calibration device having a sensor covering at least the entire bottom surface can be used for different types of substrate support, such as substrate supports shown in FIGS. 4A-4B, 5A-5B, 6A-6B and 7A-7B. The types of substrate support that the calibration device 100 or 200 can be used therefor are not limited to the ones shown in FIGS. 4A-4B, 5A-5B, 6A-6B and 7A-7B. In some embodiments, the calibration device 100 or 200 is transferred from a factory interface to a loadlock chamber by a robot disposed in the factory interface.

Figure 8:
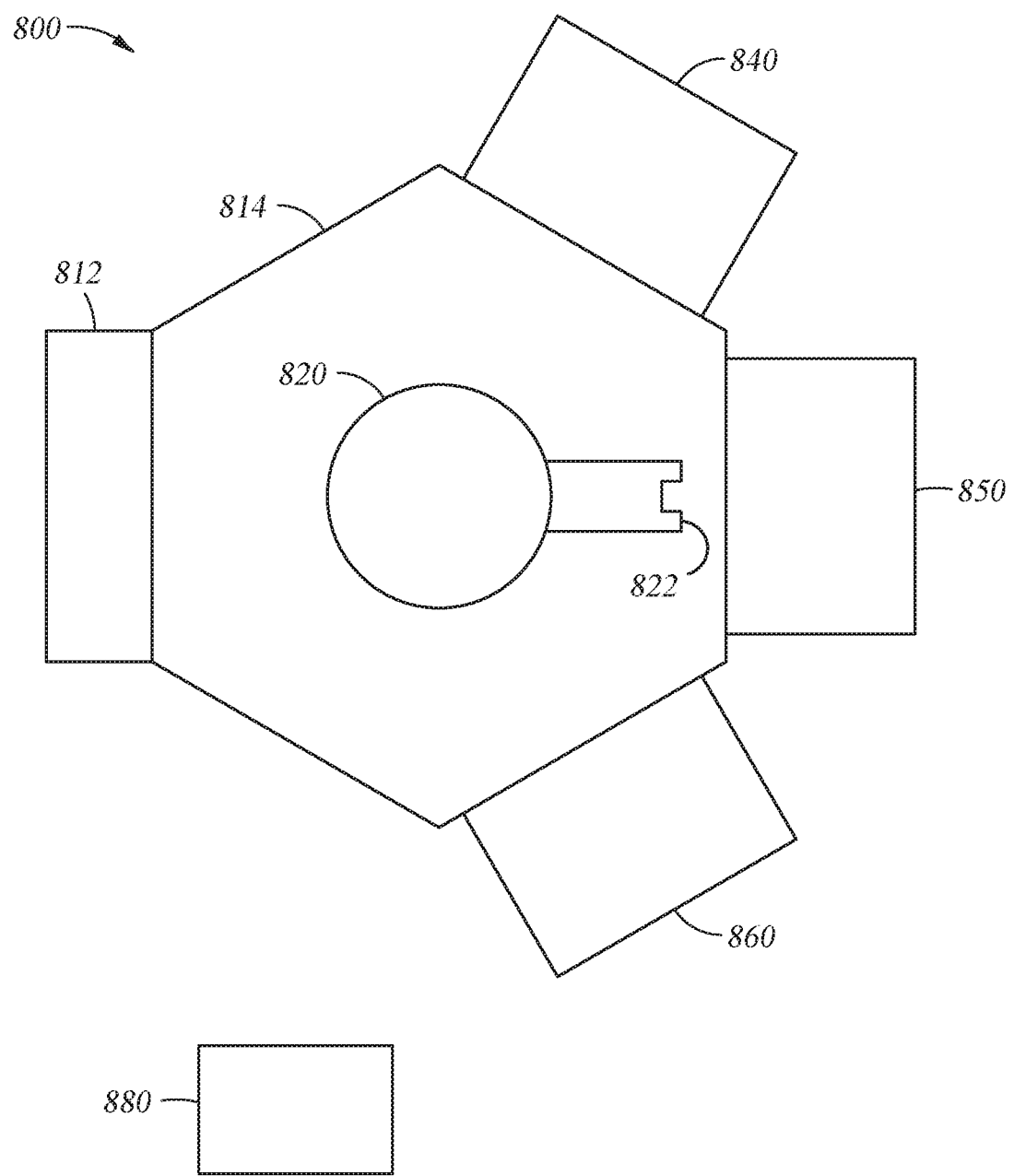
FIG. 8 illustrates a schematic, top view of an apparatus according to one embodiment described herein.

FIG. 8 illustrates a schematic, top view of an apparatus 800 according to one embodiment described herein. The apparatus 800 may be a cluster tool including a loading station 812, a transfer chamber 814 coupled to the loading station 812, a plurality of processing chambers 840, 850, 860 coupled to the transfer chamber 814. The apparatus 800 may also include a controller 880. The controller 880 may receive contact or proximity data from a data storage or transmitter, such as the data storage or transmitter 110 or 210. The controller 880 may calculate a center point location of the substrate support on the calibration device based on the contact or proximity data and compare the calculated center point location to a known actual center point location of the calibration device. The actual center point location information may be stored in the memory within the controller or the calibration device, and may be related to features found on each of the specific substrate supporting elements found in the apparatus 800.

As shown in FIG. 8, a robot 820 is disposed within the transfer chamber 814. The robot 820 may include an end effector 822 for transferring a substrate into and out of the processing chambers 840, 850, 860. The processing chambers 840, 850, 860 may include substrate supports having different contact points. A single calibration device, such as the calibration device 100 or 200, can thus be used to calibrate the robot 820 so that it can transfer a substrate into and out of multiple differently configured processing chambers 840, 850, 860 including processing chambers that have substrate supports that have different contact points. The calibration device, such as the calibration device 100 or 200, may be placed on the substrate support inside each of the processing chambers 840, 850, 860 while the processing chambers 840, 850, 860 is under vacuum since the calibration device may be wireless. In some embodiments, the temperature inside the processing chambers 840, 850, 860 may be at or close to an elevated processing temperature. There is no need to open the processing chambers 840, 850, 860 to atmospheric pressure and then pump down to vacuum condition, which leads to reduced calibration time. Another robot (not shown) may be located inside of the loading station 812 for transferring substrates into and out of the apparatus 800.

In some embodiments, the calibration device, such as the calibration device 100 or 200, is used to identify a cause of product defects. To identify a cause of product defects, the calibration device may be placed on a substrate support in each processing chambers 840, 850, 860 of the apparatus 800 to establish a baseline of the location of the substrate relative to the substrate support in each processing chamber 840, 850, 860. If there is an issue, such as misalignment type defect patterns found on a wafer, the cause of the issue can be quickly identified by using the calibration device in each processing chamber 840, 850, 860 to obtain current information regarding the location of the substrate relative to the substrate support. The processing chamber with the highest difference in the current information compared to the baseline may be the cause of the issue. In other words, an offset for each processing chamber 840, 850, 860, and the processing chamber with the largest offset may be the cause of the issue. In some embodiments, the calibration device, such as the calibration device 100 or 200, can be used to record a localized contact signature over time. Contact signature may be contact data gathered over time during which the substrate is lifted by lift pins in a station or a processing chamber. Contact signature may be contact data gathered as the substrate is being transferred by the robot. The contact signature can be the baseline and compared to for troubleshooting.

While the foregoing is directed to embodiments of the present disclosure, other and further embodiments of the disclosure may be devised without departing from the basic scope thereof, and the scope thereof is determined by the claims that follow.

What is claimed is:

1. A calibration device, comprising:
   a body including a first surface having an edge portion, a second surface opposite the first surface, and a third surface connecting the edge portion of the first surface and the second surface, wherein the body comprises glass;
   a sensor disposed on the second surface, wherein the sensor covers the entire second surface, the edge portion of the first surface, and the third surface;
   a battery disposed on the first surface; and
   a data storage or transmitter disposed on the first surface.

2. The calibration device of claim 1, wherein the sensor is a resistive, capacitive, tactile, optical, or piezoelectric sensor.

3. The calibration device of claim 1, further comprising an enclosure disposed on the first surface enclosing the battery and the data storage or transmitter.

4. The calibration device of claim 1, wherein the body is circular and has a diameter ranging from about 150 mm to about 450 mm.

5. The calibration device of claim 1, wherein the body is rectangular or square.

6. The calibration device of claim 1, wherein the transmitter uses Bluetooth® protocol.

7. A method, comprising:
   placing a calibration device on a first substrate support located inside of a first station by a robot;
   receiving first contact or proximity data from the calibration device;
   calculating a center point location of the first substrate support on the calibration device based on the first contact or proximity data;

comparing the calculated center point location of the first substrate support on the calibration device to an actual center point location of the calibration device to determine a first offset between the calculated center point location of the first substrate support on the calibration device and the actual center point location of the calibration device; and calibrating the robot using the first offset.

8. The method of claim 7, wherein the calibration device comprises a sensor, wherein the sensor covers a surface of the calibration device, and wherein the sensor is in contact with the first substrate support.

9. The method of claim 7, further comprising placing the calibration device on a second substrate support located inside of a second station by the robot, wherein the second substrate support has different contact points with the calibration device than the first substrate support.

10. The method of claim 9, further comprising:
receiving second contact or proximity data from the calibration device;
calculating a center point location of the second substrate support, on the calibration device based on the second contact or proximity data;
comparing the calculated center point location of the second substrate support on the calibration device to the actual center point location of the calibration device to determine a second offset between the calculated center point location of the second substrate support on the calibration device and the actual center point location of the calibration device; and
calibrating the robot using the second offset.

11. The method of claim 10, further comprising:
placing the calibration device on a third substrate support located inside of a third station by the robot, wherein the third substrate support has different contact points with the calibration device than the first or second substrate support;
receiving third contact or proximity data from the calibration device;
calculating a center point location of the third substrate support on the calibration device based on the third contact or proximity data;
comparing the calculated center point location of the third substrate Support on the calibration device to the actual center point location of the calibration device to determine a third offset between the calculated center point location of the third substrate support on the calibration device and the actual center point location of the calibration device; and
calibrating the robot using the third offset.

12. The method of claim 11, further comprising comparing the first offset, the second offset, and the third offset to determine a station of the first, second, and third stations is a cause of product defects.

13. A calibration device, comprising:
a body including a first surface having an edge portion, a second surface opposite the first surface, and a third surface connecting the edge portion of the first surface and the second surface, wherein the body is circular and has a diameter ranging from about 150 mm to about 450 mm;
a sensor disposed on the second surface, wherein the sensor covers the entire second surface, the edge portion of the first surface, and the third surface;
a battery disposed on the first surface; and
a data storage or transmitter disposed on the first surface.

14. The calibration device of claim 13, further comprising an enclosure disposed on the first surface enclosing the battery and the data storage or transmitter.

15. The calibration device of claim 13, wherein the sensor is a resistive, capacitive, tactile, optical, or piezoelectric sensor.

16. A calibration device, comprising:
a body including a first surface having an edge portion, a second surface opposite the first surface, and a third surface connecting the edge portion of the first surface and the second surface;
a sensor disposed on the second surface, wherein the sensor covers the entire second surface, the edge portion of the first surface, and the third surface, wherein the sensor has a resolution of at least 30 microns;
a battery disposed on the first surface; and
a data storage or transmitter disposed on the first surface.

17. The calibration device of claim 16, wherein the body is circular and has a diameter ranging from about 150 mm to about 450 mm.

18. The calibration device of claim 16, wherein the body is rectangular or square.

19. The calibration device of claim 16, wherein the body comprises glass.

20. The calibration device of claim 16, wherein the sensor is a resistive, capacitive, tactile, optical, or piezoelectric sensor.

* * * * *